United States Patent
Chu et al.

(10) Patent No.: US 6,934,864 B2
(45) Date of Patent: Aug. 23, 2005

(54) SYSTEM AND METHOD FOR CO-OPERATIVE THERMAL MANAGEMENT OF ELECTRONIC DEVICES WITHIN A COMMON HOUSING

(75) Inventors: Simon Chu, Chapel Hill, NC (US); James Edward Hughes, Apex, NC (US); James Franklin Macon, Jr., Apex, NC (US); William Joseph Piazza, Holly Springs, NC (US); Michael Scott Rollins, Durham, NC (US); Sharon Lynn Sanders-Fore, Apex, NC (US); Hoyt Conis Simmons, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 612 days.

(21) Appl. No.: 10/044,494

(22) Filed: Jan. 11, 2002

(65) Prior Publication Data

US 2003/0135767 A1 Jul. 17, 2003

(51) Int. Cl.$^7$ ................................................ G06F 1/30
(52) U.S. Cl. ........................ 713/324; 713/300; 713/320
(58) Field of Search .............................. 713/300, 320, 713/324

(56) References Cited

U.S. PATENT DOCUMENTS

| | | | | |
|---|---|---|---|---|
| 4,308,911 A | * | 1/1982 | Mandl | ........................ 165/209 |
| 4,611,289 A | * | 9/1986 | Coppola | ..................... 713/300 |
| 5,761,406 A | * | 6/1998 | Kobayashi et al. | ......... 713/340 |
| 6,029,119 A | | 2/2000 | Atkinson | |
| 6,134,667 A | | 10/2000 | Suzuki et al. | |
| 6,198,245 B1 | | 3/2001 | Du et al. | |
| 6,212,644 B1 | | 4/2001 | Shimoda et al. | |
| 6,249,885 B1 | | 6/2001 | Johnson et al. | |
| 6,367,022 B1 | * | 4/2002 | Gillespie et al. | ............ 713/300 |
| 6,651,180 B1 | * | 11/2003 | Wickeraad | ................... 713/502 |
| 6,765,802 B1 | * | 7/2004 | Ridley | ........................ 361/767 |

OTHER PUBLICATIONS

Bresniker et al, System and method for intelligent control of power consumption of distributed services during periods when power consumption must be reduced, Oct. 31, 2001, US PGPUB.*

* cited by examiner

Primary Examiner—Lynne H. Browne
Assistant Examiner—Anand B. Patel
(74) Attorney, Agent, or Firm—Martin J. McKinley; Dillon & Yudell LLP

(57) ABSTRACT

A method for co-operative thermal management of a number of independent electronic devices housed within a common enclosure that includes designating a priority number and measuring a temperature for each of the independent electronic devices. Next, for each of the independent electronic devices, the measured temperature is evaluated to determine if it exceeds a threshold value for the independent electronic device. If the measured temperature exceeds a threshold value, a count-down value is initialize to the designated priority number of the independent electronic device. Following which, the count-down value is evaluated to determine if it is equal to zero. If the count-down value is equal to zero, the independent electronic device is powered down. However, if the count-down value is not equal to zero, a specified time interval is allowed to expire before the count-down value is decremented and re-evaluated to determine if it is equal to zero.

21 Claims, 5 Drawing Sheets

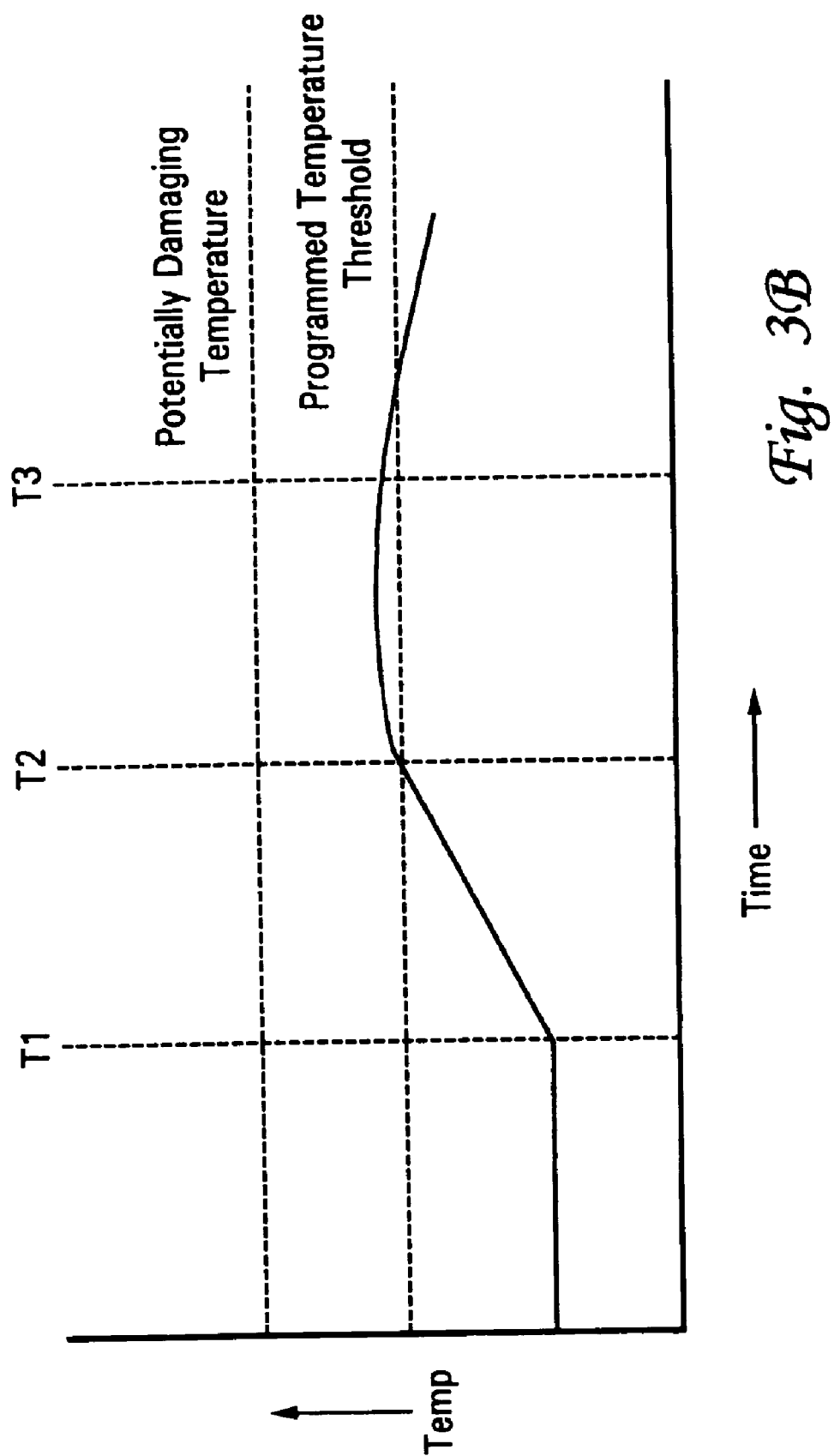

SYSTEM AND METHOD FOR CO-OPERATIVE THERMAL MANAGEMENT OF ELECTRONIC DEVICES WITHIN A COMMON HOUSING

BACKGROUND OF THE INVENTION

1. Technical Field

The present invention relates in general to thermal management of electronic devices and, in particular, to managing the operation of electronic devices in response to a thermal stress condition. More particularly, the present invention relates to a system and method for co-operative thermal management of independent electronic devices housed within a common enclosure.

2. Description of the Related Art

In computing environments where resources are shared, there is always a concern that a failure of a shared resource may affect all of the devices that depend upon it. One example of this is the case where a failure of a cooling fan jeopardizes the operation of multiple servers in a server blade environment. Products often include multiple fans to allow for the fact that one might fail. However, when a fan fails, the remaining fans may not be able to cool the entire configuration of server blades. It may therefore be necessary to turn off all of the devices within the enclosure to reduce the temperature or risk damaging all of the devices in that enclosure. Ideally, it should be possible to deal with this situation without taking all of the servers in the affected enclosure out of service. For example, it would be better to address the failure of a single fan by taking selected servers completely out of service or by gracefully degrading the performance of all servers.

In some cases, such as an arrangement of server blades within a chassis may include a separate service processor that handles chassis-level management functions and the service processor may turn some devices off to reduce the thermal load. However, having a centralized service processor designated to handle the management functions introduces a single failure point that may be catastrophic in the event that the service processor fails for whatever reasons. With the loss of the service processor, thermal management of the server blades may cease to exist which, in turn, may result in the shut-down of all the server blades to prevent any potential thermal stress conditions from adversely affecting the server blades. Furthermore, lower cost products may opt to eliminate this service processor and its associated management functions. In addition, circumstances may prevent the individual server blade devices from communicating with each other. For example, they may not be connected on a common network, or they may be running different sets of applications under different operating systems, etc. This makes it difficult for the server blades to co-operate in dealing with chassis level problems such as a fan failure.

Individual server blades may be capable of detecting the over-temperature condition and shutting themselves down when a programmed temperature threshold is exceeded. However, this can still result in all of the server blades in an enclosure powering down. Due to the slow rate at which the temperature in the enclosure changes, they may all sense the over-temperature condition and make a decision to power themselves down before the reduction in thermal load can bring the enclosure's internal temperature back down to acceptable levels.

Accordingly, what is needed in the art is an improved method by which devices, such as server blades, can co-operate to resolve thermal problems within their shared enclosure without the need for a coordinating service processor or communication between the devices.

SUMMARY OF THE INVENTION

To address the above discussed deficiencies in the prior art, and in accordance with the invention as embodied and broadly described herein, a method for co-operative thermal management of a number of independent electronic devices housed within a common enclosure is disclosed. The term "independent electronic device" is utilized within the context of the present invention to mean that there is no separate or dedicated device, apart from the independent electronic device, that monitors and controls the environmental operation of the independent electronic device in response to varying thermal conditions. Thus, there is no single "controller" that monitors and controls the operation of the independent electronic devices in response to the thermal conditions in the common enclosure. The method includes designating a priority number and measuring a temperature for each of the independent electronic devices. Next, for each of the independent electronic devices, the measured temperature is evaluated to determine if it exceeds a threshold value for the independent electronic device. If it is determined that the measured temperature exceeds a threshold value, a count-down value is initialize to the designated priority number of the independent electronic device. Following which, the count-down value is evaluated to determine if it is equal to zero. If the count-down value is equal to zero, the independent electronic device is powered down. On the other hand, if the count-down value is not equal to zero, a specified time interval is allowed to expire before the count-down value is decremented and re-evaluated to determine if it is equal to zero.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3B illustrates an exemplary graph depicting the result of co-operative temperature reduction implemented on the data processing system depicted in FIG. 1 in the event of a temperature rise.

DETAILED DESCRIPTION

Figure 1:
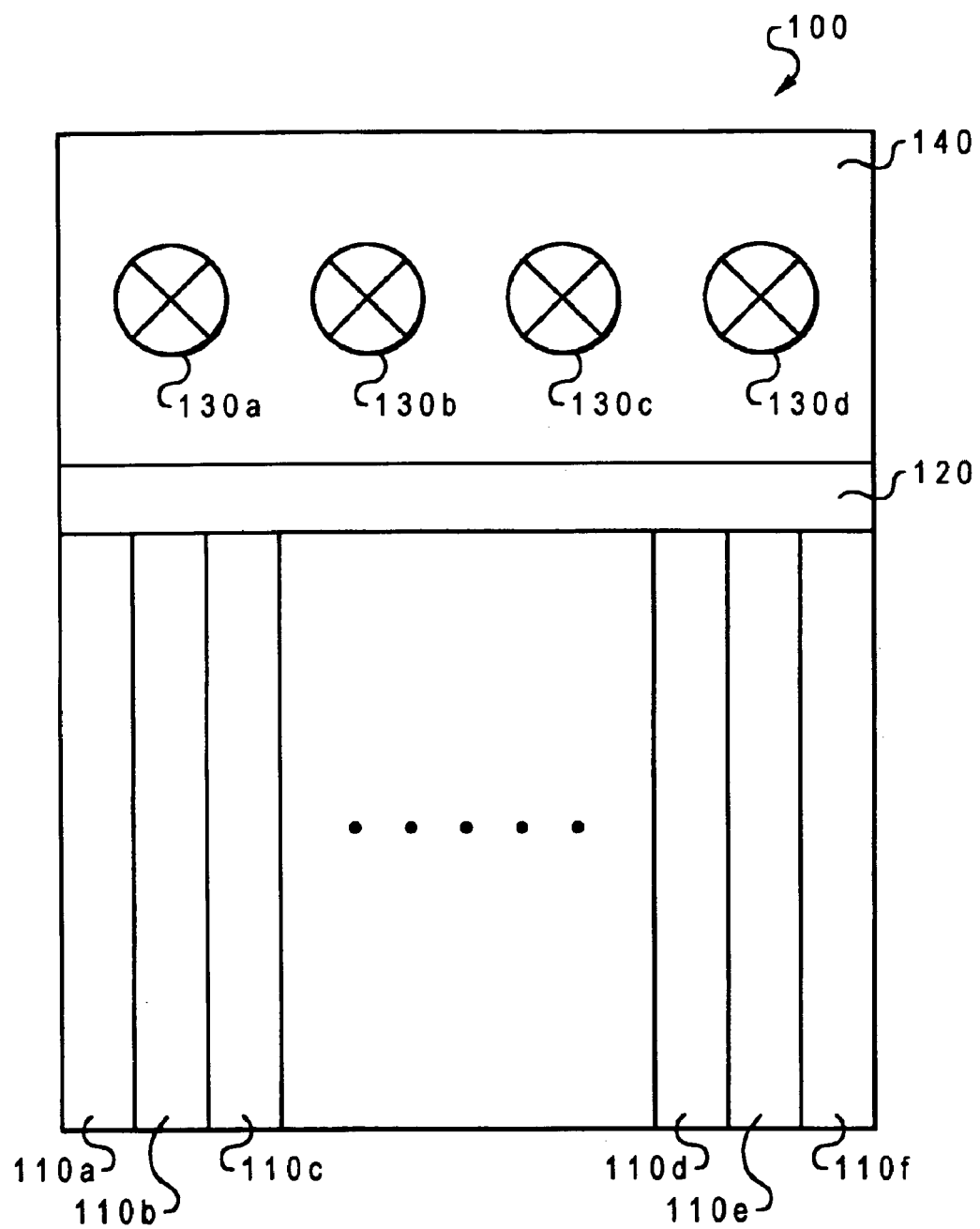
FIG. 1 illustrates an exemplary data processing system that provides a suitable environment for the practice of the present invention.

With reference now to the figures and in particular with reference to FIG. 1, there is depicted an exemplary data processing system 100 that provides a suitable environment for the practice of the present invention. Exemplary data processing system 100, as depicted in FIG. 1, includes a plurality of independent appliance servers, generally designated 110a–110f, housed in a common enclosure 140. These appliance servers are typically dedicated independent electronic devices with embedded applications that separate the various computing workloads and which may be remotely managed. For example, a first appliance server 110a may be a dedicated Web server, a second appliance server 110b may be a storage server while a third appliance server 110c function as a load balancing server. The other appliance servers may provide caching, backup or security functions. In an advantageous embodiment, the plurality of appliance servers 110a–110f are adaptive appliance server "blades", i.e., single-board devices, that are mounted in a rack configuration with a backplane 120 providing the power and connectivity. In this configuration, these server blades will be capable of switching tasks through remote management, as each server blade can be dynamically loaded with software optimized for the function of the server blade, for example, handling e-mail, Internet security or content caching. Data processing system 100 also includes a plurality of cooling fans, designated first through fourth cooling fans 130a–130d, that provide a means for providing environmental control for the electronic devices within common enclosure 140.

Although the present invention will be described in the context of a data processing system employing a plurality of independent appliance servers that share a common enclosure, the present invention does not contemplate limiting its practice to this one specific embodiment. The present invention may be advantageously utilized by independent pieces of rack-mounted equipment, such as server blades, within a rack enclosure, multiple server blade devices within a chassis, circuit cards within a network switch chassis, etc. Furthermore, the principles disclosed by the present invention may also be advantageously applied to higher order packaging schemes, e.g., multiple server blades within a chassis, multiple chassis within a rack or multiple racks within a room.

Figure 2:
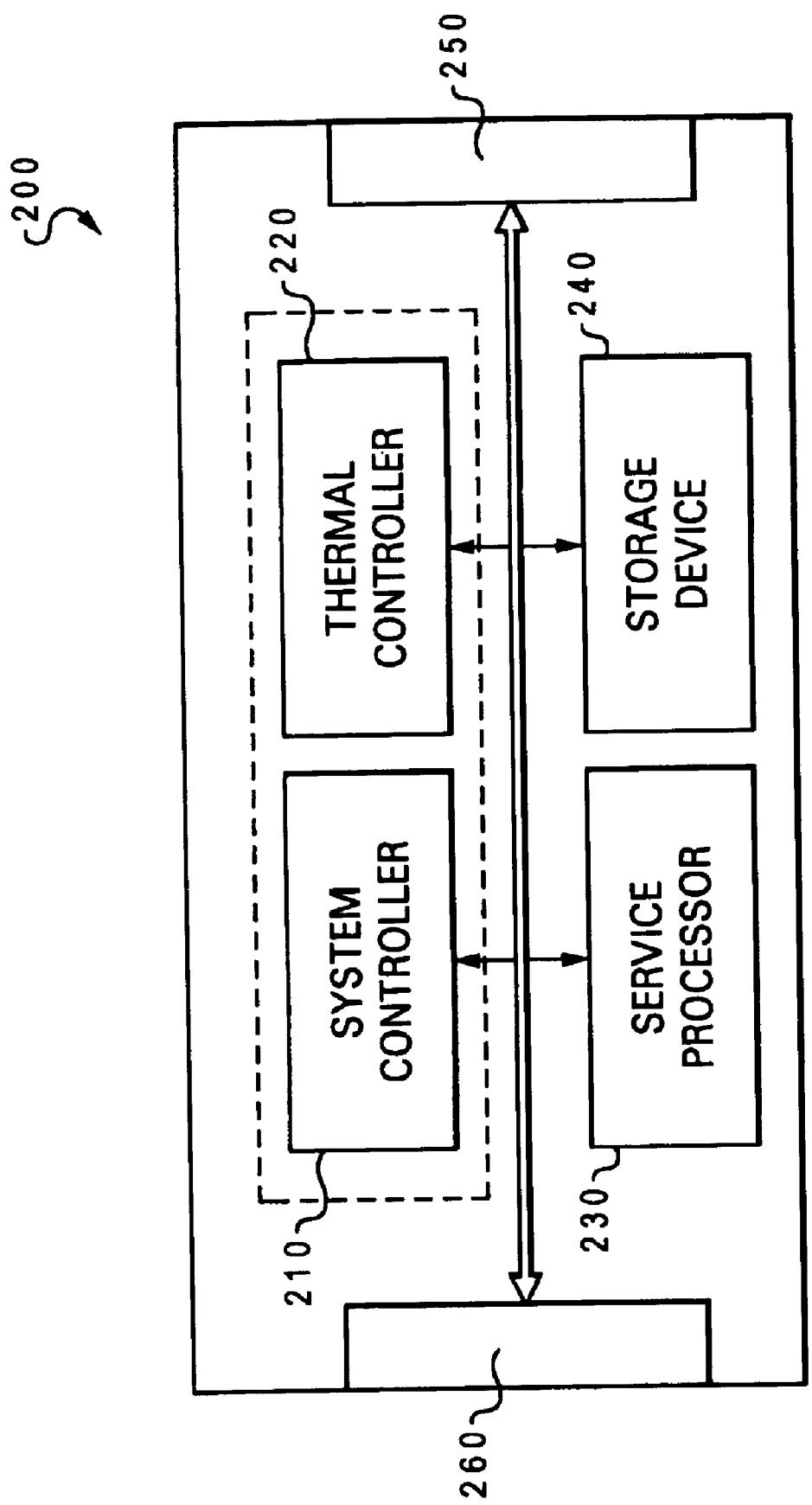
FIG. 2 illustrates a simplified block diagram of an embodiment of an exemplary appliance server.

Turning now to FIG. 2, there is illustrated a simplified block diagram of an embodiment of an exemplary independent appliance server 200. As shown, appliance server 200 (analogous to the plurality of appliance servers 110a–110f shown in FIG. 1) includes a system controller 210 coupled to a service processor 230 and a storage device 240, such as a hard disk drive. Appliance server 200 also includes a thermal controller 220 that is utilized to monitor and control the environmental operating condition of appliance server 200. In another advantageous embodiment, system controller 210 and thermal controller 220 may be embodied in a single controller. A backplane connector 250 provides the means for connecting appliance server 200 to a backplane (analogous to backplane 120 depicted in FIG. 1) while a control panel 260 includes operator controls and displays for appliance server 200.

Prior to describing the co-operative thermal management processes, the following conditions are assumed for an exemplary appliance server, or server blade:
(1) Appliance server 200 is capable of detecting the temperature at one or more key points, i.e., locations, on the device. As is well known in the art, conventional temperature sensors, or thermocouples, can be advantageously utilized. The measured temperature readings are then provided to thermal controller 220 or system controller 210, in the event that a separate thermal controller is not employed by the electronic device.
(2) Appliance server 200 has access to one or more programmed temperature thresholds that represents a temperature indicative of a problem but not high enough to cause damage. These thresholds values do not necessarily have to be the same for all devices, however, in general, most devices will typically have thresholds around the same temperature value. In other advantageous embodiments, a unique threshold may be associated with each individual temperature sensor within a device if more than one sensor is used.
(3) Appliance server 200 is capable of power managing itself in one or more ways. This may include the ability to turn it's own power off, reduce processor clock speeds, power manage subsystems within the device, etc. For those devices that are capable of powering themselves off, a mechanism to signal the operating system to shut down "gracefully" before removing power is generally utilized to ensure that any currently executing programs or applications are not abruptly terminated and/or an indication is provided, for example, utilizing control panel 260.
(4) Appliance server 200 is assigned a priority number that relates to the order in which devices within the shared enclosure should be taken off-line. Larger priority numbers are typically associated with those devices that are required to stay up longer when thermal problems develop. For example, a device with an assigned priority of 5, on a scale of 0–5, may be very critical to running an e-business and must remain up at all times, whereas, on the other hand, a device with an assigned priority of 0 may be a dispensable backup server which does not impact the business at all if it goes down at any time. Appliance server 200 is also assigned a second priority number that relates to the order in which devices within the shared enclosure should be brought on-line following, e.g., correction of a thermal stress condition. In contrast to the first priority number, a device with a lower second priority number are more important and will be brought on-line sooner than those devices with a higher second priority number. The present invention recognizes that one skilled in the art may change the co-operative thermal management processes disclosed by the present invention so that the same priority number may be utilized for both powering down a device in response to a thermal crisis and powering up when the crisis is resolved. The present invention does not contemplate limiting its practice to having two different priority numbers. However, utilizing different values for the two priority numbers provides the flexibility of managing the process for taking a device out-of-service and the process for placing a device back in-service separately. In an advantageous embodiment, the assigned priority numbers are stored in a persistent memory within the device, e.g., in CMOS, battery-backed memory, on a hard file, etc.
(5) Appliance server 200 is capable of performing co-operative thermal management processes 300 and 400, which will be described in greater detail hereinafter, for example, either as an application running on a service processor uniquely associated with the device or as an agent running on the device itself.

The co-operative thermal management operations of appliance server 200 as part of a plurality of electronic devices which are housed in a common enclosure will hereinafter be described in greater detail in conjunction with FIGS. 3A and 4, with continuing reference to FIGS. 1 and 2.

Figure 3A:
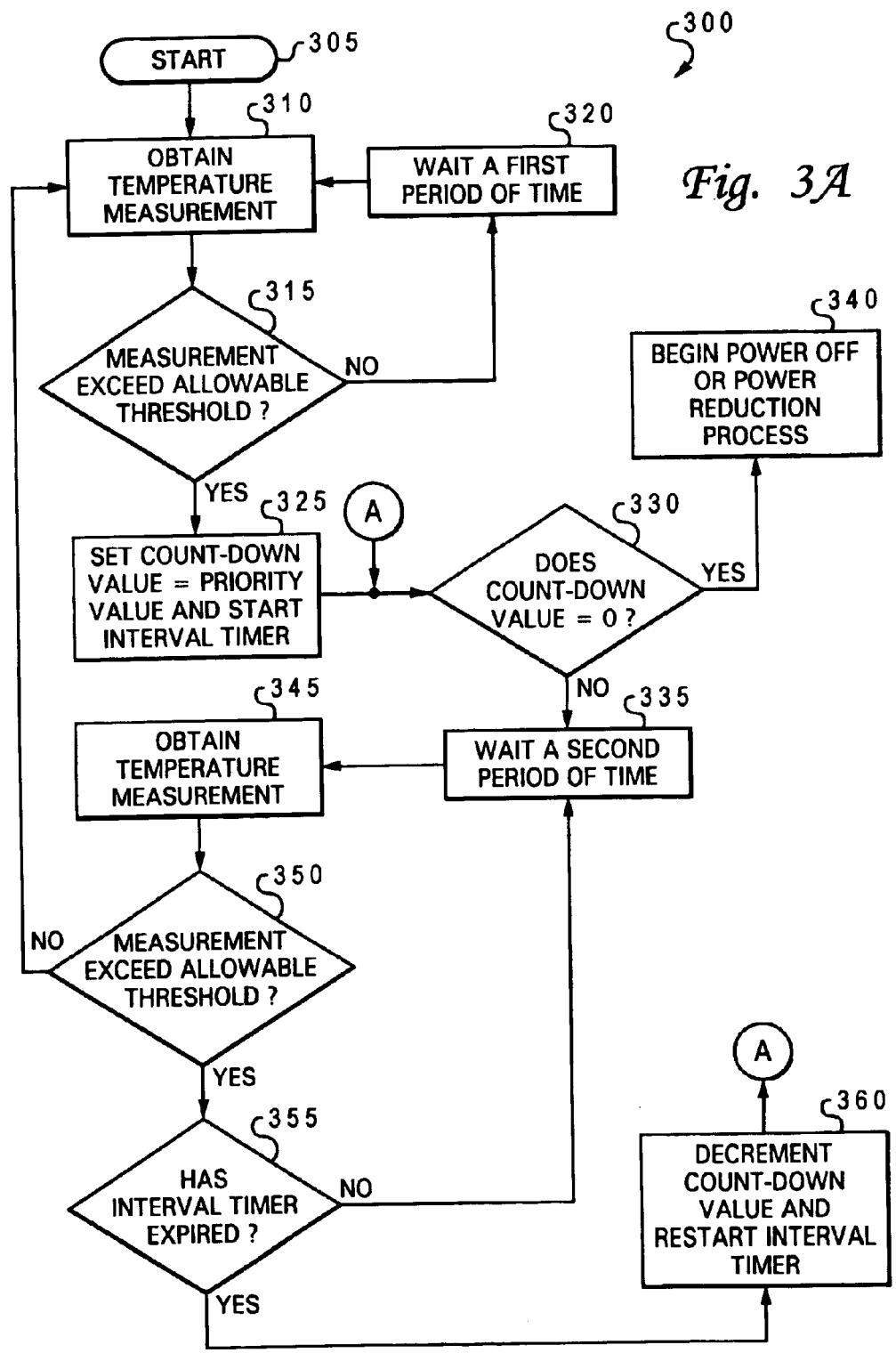
FIG. 3A illustrates a high level process flow of an embodiment of co-operative thermal management according to the principles disclosed by the present invention.

Referring now to FIG. 3A, there is depicted a high level process flow of an embodiment of co-operative thermal management 300 according to the principles disclosed by the present invention. For ease of explanation, process 300 will described in the context of a single device, in particular appliance server 200. It should be noted, however, that the execution of process 300 by appliance server 200 is representative of the execution of the co-operative thermal management process conducted by each of the plurality of appliance servers 110a–110 f. Process 300 is initiated, as depicted in step 305, for example, at a predefined time interval when a device, i.e., appliance server 200, is "prompted" to determine its current thermal condition. This prompt, in another advantageous embodiment, may also be initiated when a specific event, such as when the temperature of common enclosure 140 has reached a specific temperature or when one of the plurality of cooling fans 130a–130d has failed. Following which, appliance server 200 measures its own temperature at one or more locations depending on the number of temperature sensors utilized, as illustrated in step 310.

Appliance server 200 next, as depicted in decisional step 315, compares the measured temperature reading(s) with the programmed threshold value(s). If it is determined that the measured temperature reading does not exceed the stored threshold value, process 300 proceeds to wait, as illustrated in step 320, a first predetermined period of time before it repeats the step 310. This first predetermined period of time, e.g., 500 milliseconds, is generally selected based on the type of devices and their configuration to achieve a particular desired result. However, if in decisional step 315, it is determined that the measured temperature reading exceeds the threshold value, process 300 proceeds to initialize a countdown variable by setting the countdown variable to the priority value of appliance server 200, e.g., 2 on a scale of 0 to 5, with 0 representing the devices which should power down first in response to thermal problems, as depicted in step 325. Additionally, process 300 also initiates an interval timer, such as a clock, to time an interval, e.g., 5 minutes, that is selected to be of sufficient time for the fans, or remaining fans (in the event of a fan failure), to cool down common enclosure 140 once the lower priority devices have reduced their power consumption. It should be noted that for those devices that have a designated priority number of 0, there is no time interval before they are powered down. These devices with designated 0 priority number will be required to participate in power reduction activities immediately and proceed to begin their process of powering down or otherwise reducing their power consumption.

Following the initiation of the interval timer, process 300 proceeds to determine, as illustrated in decisional step 330, whether appliance server 200 countdown variable is equal to zero. In the present illustrative example, since appliance server 200 countdown variable is 2, process 300 proceeds to enter a wait interval, e.g., 500 milliseconds, as depicted in step 335. During this wait interval, other devices with lower priority numbers will initiate their power reduction process, either by completely powering off or implementing a power reduction scheme. In either case, the reduction in power consumption will begin to reduce the overall temperature in the common enclosure 140.

At the completion of the wait interval, process 300 continues whereby appliance server 200 obtains another temperature measurement, as illustrated in step 345. Following which, the obtained temperature measurement is again compared to appliance server's 200 allowable threshold value, as depicted in decisional step 350. If it is determined in decisional step 350 that the measured temperature has dropped below the threshold value, e.g., due to the reduced power consumption of the lower priority devices in the shared enclosure, process 300 proceeds back to step 310 to resume the normal cycle of monitoring its temperature. However, if it is determined that the measured temperature is still above the allowable threshold value, process 300 proceeds to determine, as illustrated in decisional step 355, if the interval timer has expired.

If process 300 determines at decisional step 355 that the interval timer has not expired, process 300 proceeds to step 335 to wait a specified interval (e.g., 500 milliseconds) before obtaining another temperature measurement to determine if the temperature has fallen below the allowable threshold value for appliance server 200. It should be noted again that the selection of the value of the interval timer and wait interval is typically based on the type of devices being monitored and their specific thermal characteristics. On the other hand, if it is determined at decisional step 355 that the interval has expired, process 300 proceeds to restart the interval timer and decrement the countdown value, as depicted in step 360. In this exemplary illustration, since the original countdown value is 2, the countdown value is reduced by one to 1 before process 300 is returned to decisional step 330, where the countdown value is evaluated to determine if it has a value of 0. If the countdown value is not determined to be zero, process 300 repeats the events detailed in steps 335 through 360 described above until such time as when the countdown value has been decremented to 0 or the temperature has fallen below the threshold value. In the event that the countdown value has been reduced to 0 before the temperature has fallen below appliance server's 200 threshold value, process 300 proceeds to step 340 where appliance server 200 begins its power off or implementing a power reduction process.

It should be apparent from the above discussion that the devices with the lowest priority number assigned to them, i.e., the most expendable devices, will begin reducing power consumption and powering themselves off first and, after a delay long enough for the effects of their reductions to be realized, the higher priority devices will begin reducing power if required. In this manner, critical devices remain functional without degradation if "sacrificing" more expendable devices successfully lowers the temperature inside the enclosure. An illustration of the co-operative temperature reduction process is depicted in FIG. 3B.

Turning now to FIG. 3B, illustrated is an exemplary graph depicting the result of co-operative temperature reduction implemented on data processing system 100 in the event of a temperature rise. In this illustration, a fan failure, e.g., first cooling fan 130a, at time T1 causes the internal temperature of common enclosure 140 to begin rising. At time T2, the plurality of appliance servers 110a–110f begin to notice the problem as their temperature measurements begin crossing their threshold values. Some low priority servers take immediate actions to reduce their power consumption. However, their efforts are insufficient and at time T3, a second wave of appliance servers begin to reduce power. With the first two waves co-operating, the remaining functioning fans, i.e., second through fourth cooling fans 130b–130d are finally able to move enough air through common enclosure 140 to begin bringing the temperature back down and no further action is required.

The present invention is particularly beneficial in a server blade environment. For example, in a configuration of server blades performing heterogeneous functions, such as transaction processing, serving web pages, backup functions, etc., server blades can be removed from service selectively according to the role that they are playing in the network. The most expendable server blades (those performing backup functions) could be forced to turn off first and the more critical server blades (those performing transaction processing) could be operational the longest under thermal stress conditions.

Alternatively, in a configuration where all the server blades in an enclosure are performing the same function, a portion of the server blades can be made to power off under thermal stress conditions while the others remain operational. For example, the servers may be serving web pages, with some form of load balancing in front of them to evenly distribute the requests across all of the server blades. Removing a portion of the server blades from operation may reduce the site performance but is better than losing the entire web site. Furthermore, if the first group of power reductions is not sufficient to reduce the temperature into compliance, a second, third, or fourth group can be defined by assigning different priority values to the server blades.

More complicated schemes may be built upon the basic concept disclosed by the present invention. For example, some devices may attempt to reduce their power by changing their processor clock speeds upon reaching zero countdown value the first time. They may then reset the countdown value to one (or some other value) and attempt more stringent power reduction schemes upon reaching the second expiration of the interval timer. Finally, they may decide to power off completely upon having the interval timer expire a third time.

Devices that are powered off will typically remain off until an administrator intervenes, e.g., after a failing fan has been replaced, although the present invention does not prohibit other schemes such as timed-restarts, intervention by external agents, etc. In the worst case, if a device is re-powered before the problem has been corrected, the device's temperature will cross the threshold again and force the device to turn back off. A novel co-operative thermal power-up scheme according to the present invention is described hereinafter in conjunction with FIG. 4, with continuing reference to FIGS. 1 and 2.

Figure 4:
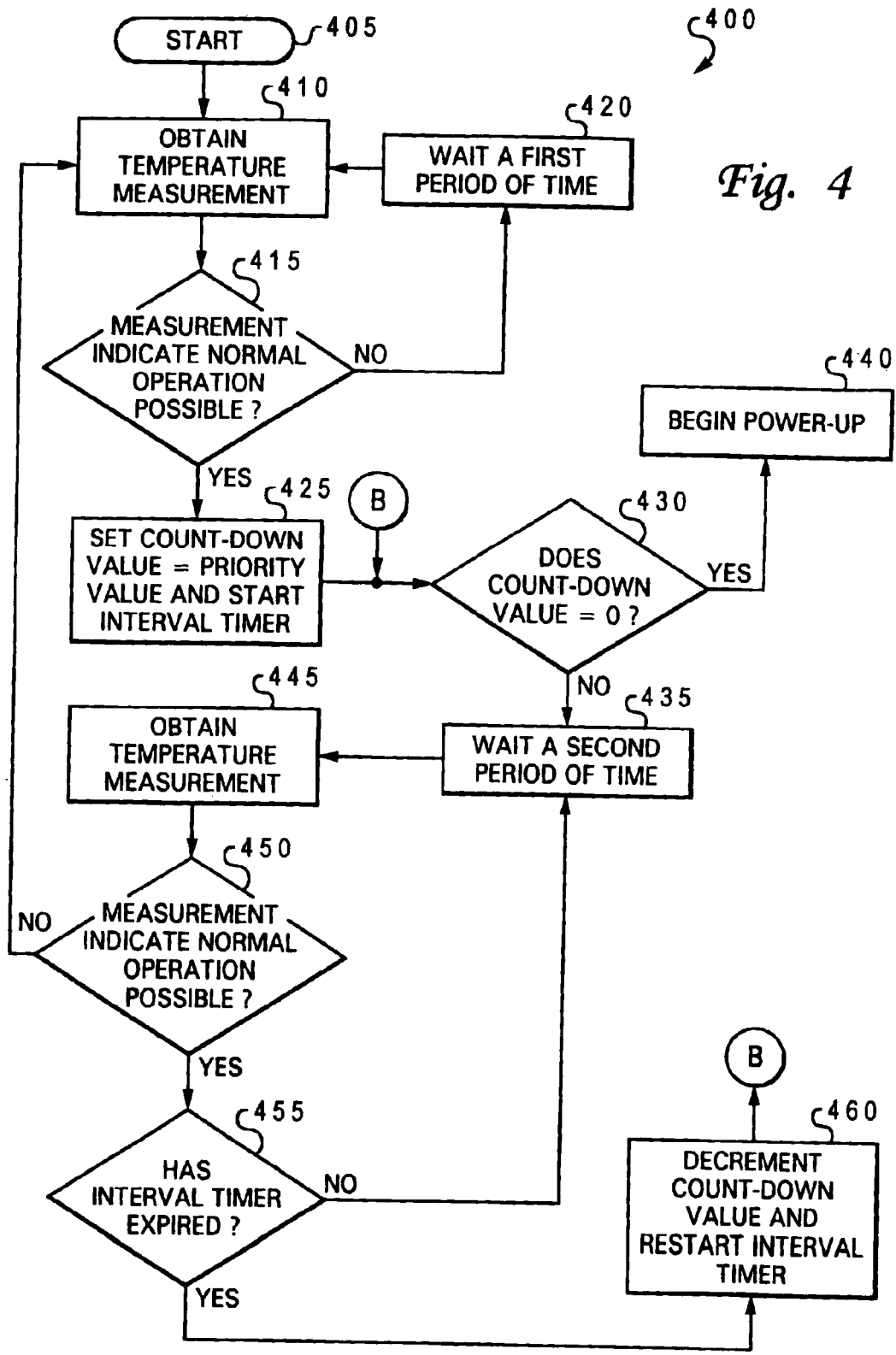
FIG. 4 illustrates a high level process flow of a second embodiment of co-operative thermal management according to the principles disclosed by the present invention.

Turning now to FIG. 4, there is depicted a high level process flow of a second embodiment of co-operative thermal management 400 according to the principles disclosed by the present invention. Process 400 illustrates when to power up devices that have been powered off, e.g., in response to a thermal stress condition, and the thermal problem has been corrected. As with process 300 above, process 400 will also described in the context of a single device, i.e., appliance server 200. Process 400 is initiated, as depicted in step 405, after appliance server 200 has been powered down due to a thermal stress condition. It should be noted that service processor 230 has not been powered down along with the rest of the devices in appliance server 200 and remains operational even when appliance server 200 is powered down. Following which, appliance server 200 measures its own temperature at one or more locations depending on the number of temperature sensors utilized, as illustrated in step 410.

Subsequently, appliance server 200, as depicted in decisional step 415, compares the measured temperature reading(s) with the programmed threshold value(s). It should be noted that the programmed threshold value utilized in process 400 to determine when appliance server 200 can be powered up is generally different from the threshold value employed and described previously in process 300 to determine when appliance server 200 should be powered down. The utilization of two different temperature threshold values to introduce a lag in when to power up and when to power down a device, i.e., hysteresis, is well known in the art to prevent appliance server 200 from repeatedly powering on and then off until the thermal problem has been resolved. If it is determined that the measured temperature reading indicates that normal operation is not possible, i.e., measured temperature is above threshold value of appliance server 200, process 400 proceeds to wait, as illustrated in step 420, a first predetermined period of time, e.g., 500 milliseconds, before it repeats step 410. During this waiting period, the temperature of common enclosure 140 is decreasing due to, e.g., the implemented thermal reduction scheme described above. However, if in decisional step 415, it is determined that the measured temperature reading does not exceed the threshold value indicating that normal operation is possible, process 400 proceeds to initialize a countdown variable by setting the countdown variable to a second priority value, e.g., 2, assigned to appliance server 200, as depicted in step 425. In contrast to process 300, a priority number of 0 indicates the most important devices and a 5, on a scale of 0 to 5, represents the "least important" devices which should power up last following the improved thermal environment. Additionally, process 400 also initiates an interval timer, such as a clock, to time an interval, e.g., 5 minutes, that is selected to be of sufficient time for the other more important devices to have powered up and affected the temperature in common enclosure 140. It should be noted that for those devices that have a designated second priority number of 0, there is no time interval before they are powered up.

Following the initiation of the interval timer, process 400 proceeds to determine, as illustrated in decisional step 430, whether appliance server 200 countdown variable is equal to zero. In the present illustrative example, since appliance server 200 countdown variable is 2, process 400 proceeds to enter a wait interval, e.g., 500 milliseconds, as depicted in step 435. During this wait interval, other devices with higher priority numbers, i.e., 0 or 1, will initiate their power up process.

At the completion of the wait interval, process 400 continues whereby appliance server 200 obtains another temperature measurement, as illustrated in step 445. Following which, the obtained temperature measurement is again compared to appliance server's 200 allowable threshold value, as depicted in decisional step 450. If it is determined in decisional step 450 that the measured temperature has increased above the threshold value, e.g., due to the increased power consumption of the higher priority devices in the shared enclosure that have been powered up, process 400 proceeds back to step 410 to resume the normal cycle of monitoring its temperature. However, if it is determined that the measured temperature is below the allowable threshold value, process 400 proceeds to determine, as illustrated in decisional step 455, if the interval timer has expired.

If process 400 determines at decisional step 455 that the interval timer has not expired, process 400 proceeds to step 435 to wait a specified interval (e.g., 500 milliseconds) before obtaining another temperature measurement to determine if the temperature has fallen below the allowable threshold value for appliance server 200. It should be noted again that the selection of the value of the interval timer and wait interval is typically based on the type of devices being monitored and their specific thermal characteristics. On the other hand, if it is determined at decisional step 455 that the interval has expired, process 400 proceeds to restart the interval timer and decrement the countdown value, as depicted in step 460. Since the original countdown value is 2, the countdown value is reduced by one to 1 before process 400 is returned to decisional step 430, where the countdown value is evaluated to determine if it has a value of 0. If the countdown value is not determined to be zero, process 400 repeats the actions detailed in steps 435 through 460 described above until such time as when the countdown value has been decremented to 0 or the temperature has risen above the allowable threshold value. In the event that the countdown value has been reduced to 0 before the temperature has risen above appliance server's 200 threshold value, process 400 proceeds to step 440 where appliance server 200 begins its power on operation.

In an advantageous embodiment, the method for co-operative thermal management disclosed by the present invention is implemented as a computer executable software program. As depicted in FIG. 2, the present invention may be implemented within an exemplary data processing unit, e.g., appliance server 200. It should be noted that although the present invention has been described, in one embodiment, in the context of an electronic device, such as an appliance server, those skilled in the art will readily appreciate that the present invention described hereinabove may be implemented, for example, by other suitable electronic modules to execute a corresponding sequence of machine-readable instructions. These instructions may reside in various types of signal-bearing media. In this respect, one aspect of the present invention concerns a programmed product, that includes signal-bearing media tangibly embodying a program of machine-readable instructions executable by a digital data processor to perform the co-operative thermal management processes described above. The present invention does not contemplate limiting its practice to any particular type of signal-bearing media, i.e., computer-readable medium, utilized to actually carry out the distribution. Examples of signal-bearing media includes recordable type media, such as floppy disks, hard disk drives and flash memory, and transmission type media such as digital and analog communication links and wireless.

While the invention has been particularly shown and described with reference to preferred embodiments, it will be understood by those skilled in the art that various changes in form and detail may be made therein without departing from the spirit and scope of the invention.

What is claimed is:

1. A method for co-operative thermal management of a plurality of independent electronic devices housed within a common enclosure, said method comprising:
    designating a priority number for each of said plurality of independent electronic devices, wherein each of said plurality of independent electronic devices has a thermal controller;
    in response to a failure of at least one cooling fan coupled with said common enclosure, measuring a temperature of each of said plurality of independent electronic devices; and
    for each of said plurality of independent electronic devices:
        determining if said measured temperature exceeds a threshold value for said independent electronic device;
        in response to a determination that said measured temperature exceeds a threshold value, initializing a count-down value to said designated priority number of said independent electronic device;
        counting down said count-down value as long as said measured temperature exceeds said threshold value; and
        in response to said count-down value reaching a pre-determined action level, powering down said independent electronic device.

2. The method for co-operative thermal management as recited in claim 1, wherein said initializing a count-down value further includes initiating an interval timer.

3. The method for co-operative thermal management as recited in claim 1, wherein said initializing a count-down value further includes waiting a first predetermined period of time before repeating said measuring a temperature of said independent electronic device in response to a determination that said measured temperature does not exceed said threshold value.

4. The method for co-operative thermal management as recited in claim 2, wherein said measuring a temperature further includes:
    determining if said count-down value is equal to zero; and
    powering-down said independent electronic device in response to a determination that said count-down value is equal to zero, otherwise waiting a second predetermined period of time before obtaining a second temperature measurement of said independent electronic device and determining if said second temperature measurement exceeds said threshold value.

5. The method for co-operative thermal management as recited in claim 4, wherein said measuring a temperature further includes:
    determining if said interval timer has expired in response to a determination that said second temperature measurement exceeds said threshold value; and
    decrementing said count-down value, and subsequently reinitiating said interval timer and repeating said determining if said count-down value is equal to zero in response to a determination that said interval timer has expired, otherwise repeat waiting a second predetermined period of time before obtaining a temperature measurement.

6. A method for co-operative thermal management of a plurality of independent electronic devices housed within a common enclosure, said method comprising:
    designating a priority number for each of said plurality of independent electronic devices, wherein each of said plurality of independent electronic devices has a service processor that remains operational when said electronic device is powered down; and
    in response to a failure of at least one cooling fan coupled with said common enclosure, measuring a temperature of each of said plurality of independent electronic devices, and for each of said plurality of independent electronic devices:
        determining if said measured temperature exceeds a threshold value for said independent electronic device;
        in response to a determination that said measured temperature exceeds a threshold value, initializing a count-down value to said designated priority number of said independent electronic device;
        counting down said count-down value as long as said measured temperature exceeds said threshold value; and
        in response to said count-down value reaching a pre-determined action level, powering down said independent electronic device.

7. The method for co-operative thermal management as recited in claim 6, wherein said initializing a count-down value farther includes initiating an interval timer.

8. The method for co-operative thermal management as recited in claim 7, wherein said measuring a temperature further includes:
    determining if said count-down value is equal to zero; and
    powering-up said independent electronic device in response to a determination that said count-down value is equal to zero, otherwise waiting a second predetermined period of time before obtaining a second temperature measurement of said independent electronic device and determining if said second temperature measurement exceeds said threshold value.

9. The method for co-operative thermal management as recited in claim 8, further comprising:
    determining if said interval timer has expired in response to a determination that said second temperature measurement does not exceed said threshold value; and
    decrementing said count-down value, and subsequently reinitiating said interval timer and repeating said determining if said count-down value is equal to zero in response to a determination that said interval timer has expired, otherwise repeat waiting a second predetermined period of time before obtaining a temperature measurement.

10. An electronic device, comprising:

a designated priority number; and a thermal controller, including:

means for, in response to a failure of at least one cooling fan coupled with said electronic device, measuring a temperature of said electronic device;

means for determining if said measured temperature exceeds a threshold value for said electronic device;

means for, responsive to a determination that said measured temperature exceeds a threshold value, initializing a count-down value to said designated priority number of said electronic device;

means for counting down said count-down value as long as said measured temperature exceeds said threshold value; and means for, responsive to said count-down value reaching a pre-determined action level, powering down said electronic device.

11. The electronic device as recited in claim 10, wherein said thermal controller is embodied in a service processor that remains operational when said electronic device is powered down.

12. The electronic device as recited in claim 11, wherein said service processor powers up said electronic device in response to a determination that said measured temperature does not exceed said threshold value and said count-down value is equal to zero.

13. The electronic device as recited in claim 11, wherein said electronic device is a server blade.

14. The electronic device as recited in claim 10, wherein said thermal controller powers down said electronic device in response to a determination that said measured temperature exceeds said threshold value and said count-down value is equal to zero.

15. A data processing system, comprising:

an enclosure; and a plurality of independent electronic devices housed within said enclosure, wherein each of said plurality of independent electronic devices having:

a designated priority; and a thermal controller, including:

means for, in response to a failure of at least one cooling fan coupled with said enclosure, measuring a temperature of said independent electronic device;

means for determining if said measured temperature exceeds a threshold value for said independent electronic device;

means for, responsive to a determination that said measured temperature exceeds a threshold value, initializing a count-down value to said designated priority number of said independent electronic device;

means for counting down said count-down value as long as said measured temperature exceeds said threshold value; and means for, responsive to said count-down value reaching a pre-determined action level, powering down said electronic device.

16. The data processing system as recited in claim 15, further comprising:

a backplane coupled to said plurality independent electronic devices; and a plurality of fans.

17. The data processing system as recited in claim 15, wherein said thermal controller is embodied in a service processor that remains operational when said independent electronic device is powered down.

18. The data processing as recited in claim 17, wherein said service processor powers up said independent electronic device in response to a determination that said measured temperature does not exceed said threshold value and said count-down value is equal to zero.

19. The data processing system as recited in claim 15, wherein said thermal controller powers down said independent electronic device in response to a determination that said measured temperature exceeds said threshold value and said count-down value is equal to zero.

20. The data processing system as recited in claim 15, wherein said independent electronic device is a server blade.

21. A computer-readable medium having stored thereon computer executable instructions for implementing a method for co-operative thermal management of a plurality of independent electronic devices housed within a common enclosure, said computer executable instructions when executed by one of said plurality of independent electronic devices perform the steps of:

designating a priority number far said independent electronic device, in response to a failure of at least one cooling fan coupled with said common enclosure, measuring a temperature of said independent electronic device;

determining if said measured temperature exceeds a threshold value for said independent electronic device;

in response to a determination that said measured temperature exceeds a threshold value, initializing a count-down value to said designated priority number of said independent electronic device and initiate an interval timer;

counting down said count-down value as long as said measured temperature exceeds said threshold value; and in response to said count-down value reaching a pre-determined action level, powering down said independent electronic device.

* * * * *

UNITED STATES PATENT AND TRADEMARK OFFICE
CERTIFICATE OF CORRECTION

PATENT NO. : 6,934,864 B2
DATED : August 23, 2005
INVENTOR(S) : Simon Chu et al.

It is certified that error appears in the above-identified patent and that said Letters Patent is hereby corrected as shown below:

Column 12,
Line 34, delete "far" and insert -- for --.

Signed and Sealed this

Sixteenth Day of May, 2006

JON W. DUDAS
*Director of the United States Patent and Trademark Office*